US006528335B2

(12) United States Patent
Almonte et al.

(10) Patent No.: US 6,528,335 B2
(45) Date of Patent: Mar. 4, 2003

(54) ELECTRICAL METHOD FOR ASSESSING YIELD-LIMITING ASPERITIES IN SILICON-ON-INSULATOR WAFERS

(75) Inventors: Marlene Isabel Almonte, Mohegan Lake, NY (US); Harold John Hovel, Katonah, NY (US); Richard Leo Kleinhenz, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 09/783,139

(22) Filed: Feb. 14, 2001

(65) Prior Publication Data

US 2002/0109521 A1 Aug. 15, 2002

(51) Int. Cl.[7] .............................................. H01L 21/66
(52) U.S. Cl. ........................................... 438/17; 438/18
(58) Field of Search .............................. 438/14, 17, 18, 438/16; 324/71.1, 71.5

(56) References Cited

U.S. PATENT DOCUMENTS 5,786,231 A * 7/1998 Warren et al. ............... 324/765
6,074,886 A * 6/2000 Henaux ......................... 257/48

OTHER PUBLICATIONS

Mrstik et al., "Improvement in electrical properties of buried SiO2 layers by high–temperature oxidation", Nov. 1995, Appl. Phys. Lett. 67 (22), pp. 3283–3285.*

K. Kawamura et al., "Experimental Verification of Buried–Oxide with Over–8MV/cm Breakdown Fields in Low–Dose SIMOX Wafers", Oct. 1997, Proceedings 1997 IEEE International SOI Conference, pp. 122–123.*

K. Kawamura et al., "Improvement of Buried Oxide Quality in Low–Dose SIMOX Wafers by High–Temperature Oxidation", Oct. 1995, Proceedings 1995 IEEE International SOI Conference, pp. 156–157.*

Revesz et al., "Photo–Injection Studies of Buried Oxide Layers in SIMOX and BESOI Structures", 1993, Proceedings 1993 International SOI Confernce, pp. 24–25.*

S. Nakashima et al., Electrical Characteristics of the Interface between the Top Si and Buried Oxide in ITOX–SIMOX Wafers, Oct. 1998, Proceedings 1998 IEEE International SOI Conference, pp. 19–20.*

S. Henaux et al., "Gate Oxide Integrity Testing on SOI Wafers without Test Structure Fabrication", Oct. 1998, Proceedings 1998 IEEE International SOI Conference, pp. 87–88.*

(List continued on next page.)

Primary Examiner—Michael Sherry
Assistant Examiner—Evan Pert
(74) Attorney, Agent, or Firm—Robert M. Trepp (57) ABSTRACT

An electrical method is described for determining the presence of certain defects in the buried oxide of silicon-on-insulator wafers which cause electrical breakdown at voltages low enough to cause failure during circuit processing. The method consists of carrying out current-voltage measurements on gold/silicon/buried oxide/substrate devices isolated by selective etching and analyzing the current-voltage behavior in terms of short circuit defect densities, low voltage breakdown defects, and excess current leakage defects. An additional method for detecting the low voltage breakdown defects is to monitor light flashes which accompany the breakdown.

18 Claims, 6 Drawing Sheets

OTHER PUBLICATIONS

Y. Gu et al., "SOI Material Characterization Using Optical Second Harmonic Generation", Oct. 1995, Proceedings 1995 IEEE International SOI Conference, pp. 94–95.*

G. Brown et al., "Moat Edge Oriented Defects and Buried Oxide Leakage In SIMOX Integrated Circuits", Oct. 1994, Proceedings 1994 IEEE International SOI Conference, pp. 133–134.*

K. Joyner, "An In–Process Evaluation Technique For Detection of Buried Oxide Leakage on SOI Materials", Oct. 1991, Proceedings 1991 IEEE International SOI Conference, pp. 64–65.*

A. Perez–Rodriguez et al., "In Depth Resolved Analysis of SIMOX Materials by Optical Characterization Techniques", Oct. 1991, Proceedings 1991 IEEE International SOI Conference, pp. 110–111.*

W. Henderson, "A Simple Characterization Method for Silicon–on–Insulator Materials Using Depletion–Mode MOSFET", Nov. 1990, IEEE Electron Device Letters, vol. 11, No. 11, pp. 552–555.*

N. Annamalai et al., "Buried Oxide Leakage Current as a Function of Total Dose", Oct. 1989, IEEE 1989 SOS/SOI Technology Conference, pp. 87–88.*

S. Hall et al., "A Rapid Assessment Technique for SOI–Substrates", Oct. 1988, Proceedings 1988 SOS/SOI technology Workshop, p. 82.*

* cited by examiner

ELECTRICAL METHOD FOR ASSESSING YIELD-LIMITING ASPERITIES IN SILICON-ON-INSULATOR WAFERS

FIELD OF THE INVENTION

This invention relates to evaluating the buried oxide of silicon-on-insulator wafers and more particularly, carrying out current-voltage measurements and analyzing the current-voltage behavior in terms of short circuit defect densities, low voltage breakdown defects, and excess current leakage defects.

BACKGROUND OF THE INVENTION

Silicon-on-insulator (SOI) starting substrate material can be used as an alternative to standard silicon (Si) wafers ("bulk silicon") to produce integrated circuits. Quality control of starting SOI wafers is necessary because such wafers are produced in "batch" processes which can have variability in defect densities, interface perfection, and contamination. Such quality control includes determining the electrical quality of the buried oxide (BOX) which serves to isolate the superficial Si layer where the devices and circuits are fabricated from the substrate, resulting in advantages of speed, lower power needed to run the circuits, and better immunity from "soft error events" caused by penetration of damaging incident particles (such as alpha rays).

Since silicon dioxide ($SiO_2$) has a dielectric breakdown strength of over 10 Megavolts per centimeter and passes only extremely small electric currents below this breakdown voltage, and since the BOX of SOI substrates is mostly $SiO_2$, it might be expected that the electrical properties of the BOX would exhibit high dielectric strength and low leakage currents also. This is generally true for the "Bonded" form of SOI substrates in which the substrate is fabricated by bonding two silicon wafers together with a layer of $SiO_2$ in-between and thinning one of the wafers of this connected pair to the desired thickness. However, the SIMOX ("separation by implantation of oxygen") form of SOI wafer, in which the substrate is created by implantation of a high or low dose of oxygen and subsequently annealed at very high temperatures for time periods sufficient for the implanted oxygen alone or the implanted and diffused oxygen to form an $SiO_2$ layer beneath the wafer surface, contains several types of defects (asperities) which affect the oxide electrically. One form of defect commonly found in SIMOX wafers consists of crystalline silicon precipitates (Si islands) located inside the BOX. Such defects are easily observed by transmission electron microscopy (TEM). Crystalline silicon precipitates inside the BOX have electrical consequences because crystalline silicon precipitates alter the electric field inside the BOX when a voltage is applied across it, increasing the leakage current and lowering the breakdown voltage. Such defects have been described, for example, by K. Kawamura et al, IEEE Internat. SOI Conference, 1997, page 122. When the BOX electrical breakdown occurs in the vicinity of one of these crystalline silicon precipitates, the temperature increases to the degree that the precipitate and its surrounding material is vaporized and the breakdown region consequently heals itself. An increase of voltage then causes a repeat of this self-healing premature breakdown at another crystalline silicon precipitate, and so on until all of the crystalline silicon precipitate regions have broken down or the final dielectric breakdown of the precipitate-free region takes place.

The BOX also contains other asperities such as amorphous silicon "clusters" dispersed throughout the BOX which are only a few tens of nanometers in size and not detected by TEM. Such defects have been described, for example, by A. G. Revesz et al, IEEE Internat. SOI Conference, 1993, page 24. They can cause excess leakage currents through the BOX, exacerbated by the concentration of the electric field by crystalline Si islands. In addition, SIMOX buried oxides may contain "pinholes" or "pipes" where the oxide may be bridged by Si regions (see, for example, Mrstik et al, Appl. Phys. Lett. Volume 67, page 3283, 1995; and K. Kawamura et al, IEEE Internat. SOI Conf., 1995, page 156).

All of these defects can cause lower yield and reduced reliability in processed circuits. The Si pipes result in short circuits between the substrate and the Si layer. The amorphous clusters and crystalline Si islands result in excess leakage currents which can cause charge trapping and device threshold voltage shifts. The crystalline Si islands result in lower breakdown voltages and can result in damage to the Si layer and BOX during high voltage processing steps such as plasma etching, plasma deposition, and the like. For these reasons, it is desirable for quality control purposes to detect the extent of these defects in the starting material before the expensive and time-consuming circuit processing has begun.

SUMMARY OF THE INVENTION

The short circuit defect density, the leakage current, and the premature, self-healing breakdowns (known as mini-breakdowns) can all be determined by the practice of the invention, resulting in quality control of the starting material which impacts yield, reliability, and performance. The electrical test structure is made by depositing a metal such as aluminum on the back of the substrate, depositing gold "dots" on the superficial semiconductor such as a Si containing layer surface above the buried oxide, contacting the Si layer with an etchant which removes the Si layer in-between the Au dots. The sample is then placed onto a measurement stage which electrically contacts the Al layer on the back side of the substrate or wafer and one of the Au dots above the superficial Si layer, performing a current-voltage measurement: a) with a fixed low voltage less than the first mini-breakdown voltage (fixed low voltages of 5 to 20 volts are typical), "stepping" at a high rate (one dot per second is typical) to contact as many of the Au dots as desired while recording the current, b) with a higher fixed voltage less than the first mini-breakdown (fixed voltages of 25 to 50 volts are typical) and stepping at a lower rate (one dot per minute is typical) for as many Au dots as desired while recording the current, c) applying a ramp voltage from a low voltage up to the expected dielectric breakdown voltage (typically applying a ramp voltage from 20 volts to 100 volts) while monitoring the current using a fast response time measurement circuit. The measurement in (a) determines the short circuit defect density; the measurement in (b) determines the leakage current; the measurement in (c) determines the mini-breakdown defect density and the voltages at which they occur. A second technique for detecting the occurrence of a mini-breakdown event is to monitor the light output from the Au dot being measured, since each mini-breakdown is accompanied by a strong light flash.

BRIEF DESCRIPTION OF THE DRAWING

These and other features, objects, and advantages of the present invention will become apparent upon consideration of the following detailed description of the invention when read in conjunction with the drawing in which.

DETAILED DESCRIPTION

Figure 1:
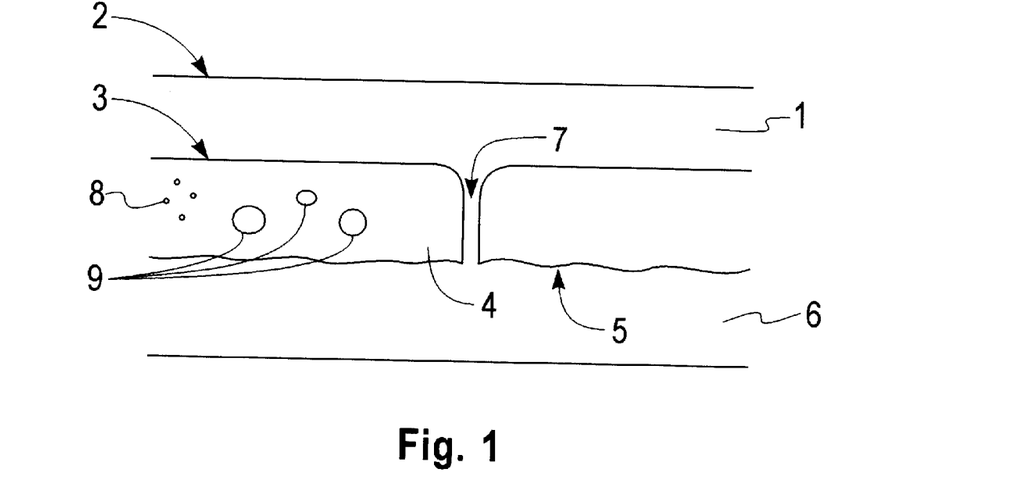
FIG. 1 is a cross-sectional view of a silicon-on-insulator structure.

A cross-sectional view of a silicon on insulator wafer used containing several types of electrically active defects is shown in FIG. 1, where 6 represents the substrate, 4 is the buried oxide, 1 is the superficial silicon layer, 2 is the surface of the Si layer, 3 is the interface between the Si layer 1 and the buried oxide 4, 5 is the interface between the substrate 6 and the buried oxide 4, 7 represents a pinhole, or "pipe," through the BOX 4 which can result in a short circuit between Si layer 1 and substrate 6, 9 represents Si "island" precipitates within the BOX 4, and 8 represents amorphous Si clusters which can act as charge traps and, along with Si islands 9, can lead to excess leakage currents. Si layer 3 may be Si alone or a Si containing semiconductor material such as an alloy of Si such as SiGe, SiGeC, SiC, etc. as constant composition layers, graded composition layers, or a combination of layers.

Figure 2:
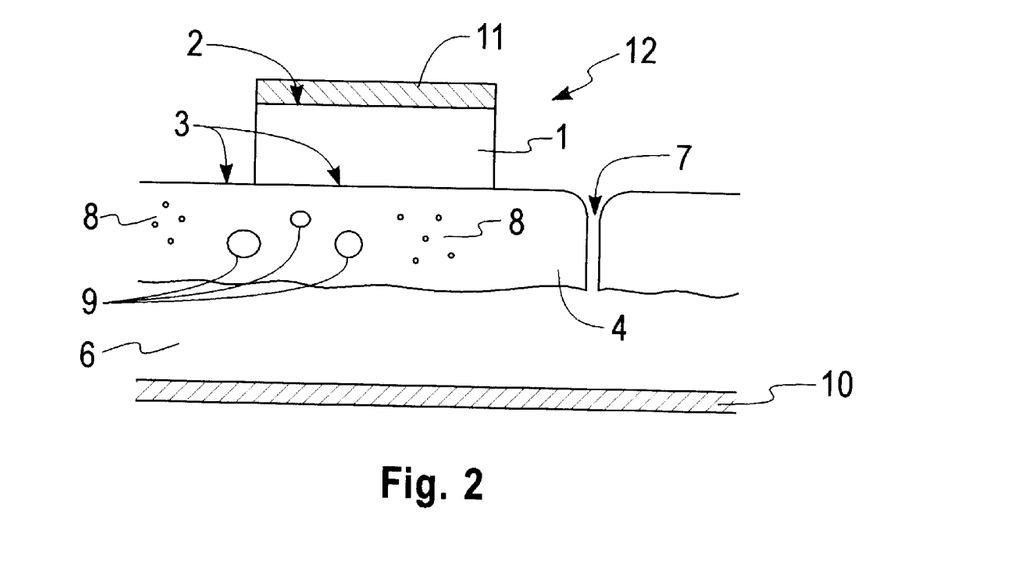
FIG. 2 is a cross-sectional view of the test structure of the invention.

A cross-sectional view of a test structure in accordance with the invention is shown in FIG. 2, where 10 represents a metal layer such as aluminum (Al), copper (Cu), or other metal material which acts as the "bottom" electrode to the substrate 6, the electrode contact to the Si layer 1 is represented by 11 and may be any metal such as gold (Au), platinum (Pt), palladium (Pd), Al, or other material as long as the layer 11 acts as a mask to prevent etching of the Si layer 1 beneath it. Fabrication of this test structure includes use of a chemical etchant either in the gas or liquid phase. For example, electrode 11 may be evaporated or sputtered Al patterned into individual mesas either by deposition through a shadow mask (a metal plate with holes) or by the use of photolithography, followed by exposure of the test structure to a plasma etching gas which removes the Si layer 1 between the Al mesas. Alternately, electrode 11 may be evaporated or sputtered Au, Pt, or Pd patterned into individual mesas by performing the deposition through a shadow mask or by use of photolithography, followed by etching the Si layer 1 in-between the mesas using a wet chemical mixture such as HNO3:HF:CH3COOH. Alternately the wet chemical etching may be carried out using potassium hydroxide mixed with water. The etching of the Si layer 1 from the regions in-between the areas protected from etching by electrode layer 11 exposes the surface 3 of the BOX 4 and ensures that each resulting individual test device 12 is isolated from all the others.

It can be seen from FIG. 2 that the probability is very high that the test device 12 will include some of the Si island defects 9 and some of the amorphous clusters 8 and therefore the current-voltage behavior of the test device 12 will be influenced by these defects. If the test device 12 overlaps a pinhole 7, a short circuit electrical behavior will take place.

Figure 3:
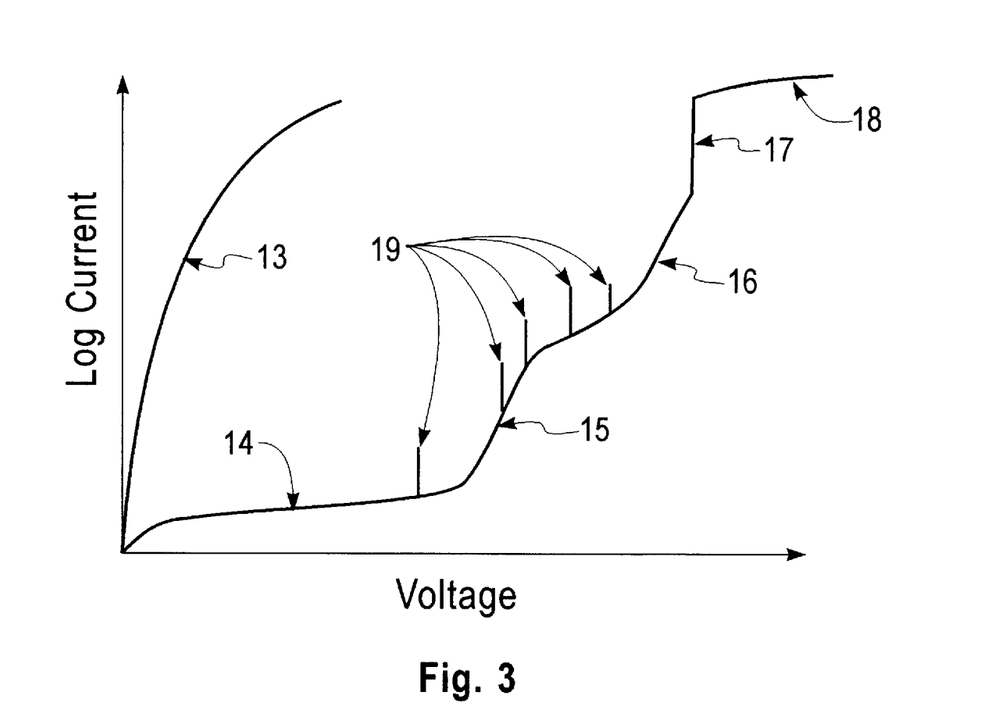
FIG. 3 is a graph showing an example of the log of the current versus voltage measured for the test structure.

FIG. 3 shows typical current voltage behavior of the test device 12 in accordance with the invention. In FIG. 3, the ordinate represents the log current and the abscissa represents voltage. If test device 12 includes a pinhole 7, a short circuit is observed such as shown by curve 13. If test structure 12 does not contain a pinhole, the current-voltage behavior traces out the curve typified by curve portions 14 to 18. Starting at zero volts, applying increasing voltage results in the low current 14 which may, for example, be in the 1 to 100 picoampere range. At higher voltages, the current starts to increase as shown by 15 as the electric field within the BOX 4 causes interactions between injected electrons and defects such as 8 and 9. A measure of the current 15 at some preselected voltage, for example one-half the dielectric breakdown voltage of the oxide at which destructive breakdown occurs, or at some preselected value of the electric field (the voltage divided by the BOX thickness), is known as the "leakage" current and is a measure of the density of Si islands and amorphous Si clusters. At still higher voltages the current increases further as shown by 16 due to "tunneling" phenomena. When the voltage is increased such that the electric field reaches the dielectric breakdown strength of the BOX 4, a final, destructive breakdown 17 takes place after which the current is only limited by the series resistance in the measurement circuit shown by curve portions 18. Attempts to retrace the behavior from zero voltage results only in the short circuit behavior 13 due to the permanent breakdown of the BOX 4 within the test device 12.

FIG. 3 also shows a series of current transients, or "spikes," represented by curves 19. These are mini-breakdowns in which the presence of a Si island 9 within the test device 12 causes a breakdown of the oxide at a lower voltage than the final breakdown 17. The Si islands 9 cause the electric field within BOX 4 to be higher in their vicinity because of the higher dielectric constant of Si compared to $SiO_2$. Therefore the current and electric field are concentrated in the vicinity of the island, and the larger the Si island, the greater the concentration and the lower the voltage at which breakdown occurs. However, the concentration of current in the vicinity of a Si island 9 causes the temperature to rise rapidly until the material is melted and/or evaporated away, such that each mini-breakdown event 19 is "self-healing," and once the breakdown and healing have taken place, the current behavior continues to trace out the curve portions 14 to 17 until the next Si island region breaks down, and so forth. Each mini-breakdown event is accompanied by a flash of light output due to the extremely high temperatures reached during the current transient. This light output can be used to record the occurrence of a mini-breakdown event, just as the spike in the current-voltage behavior can be recorded as a mini-breakdown event. Though there is some small difference in the current-voltage behavior according to the polarity of the applied voltage, the short circuit and mini-breakdown phenomena take place for either voltage polarity. In practice, a negative voltage applied to electrode 11 shown in FIG. 2 with respect to electrode 10 is preferred.

The Si islands involved in the mini-breakdown event can result in a yield loss during circuit fabrication because certain processing steps involve voltages higher than the lowest voltages at which mini-breakdowns occur. Such steps include plasma processing, reactive ion etching, and possibly sputtering. During such processing, there are no electrodes present and no current is conducted, so that the high temperatures resulting from the current being concentrated in a defect region during the test device 12 electrical measurement are not present and the mini-breakdown taking place during processing is not self-healing. Instead, the breakdown that occurs during processing causes a permanent high leakage path which lowers the yield of the circuits fabricated in their vicinity and may cause future reliability problems even in the absence of an immediate yield loss. Therefore, it is important to determine which SOI starting material or wafer includes Si islands large enough to cause mini-breakdowns at voltages low enough to cause these problems. The test structure 12 and the methods described herein in accordance with the invention are designed to fulfill this purpose.

Figure 4:
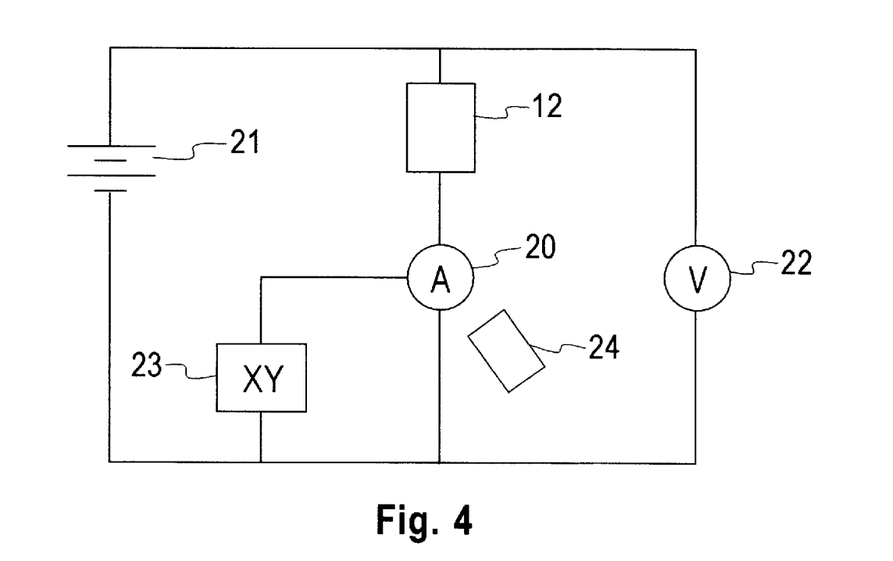
FIG. 4 is a circuit setup schematic to measure the fast minibreakdown current transient.

The current transients representing the mini-breakdowns take place in time periods of microseconds to a few milliseconds. Therefore measurement equipment such as a parameter analyzer, commonly used to measure current-voltage behavior, is not optimum to observe these yield-limiting phenomenon. These instruments average the current over time periods of tens to hundreds of milliseconds, diluting the signal coming from the fast current transient event. An example of a test circuit optimized to measure these transients is shown in FIG. 4, where 12 represents the test device, 20 represents a current meter (often an instrument known as an "electrometer") with a fast response time in the 2 millisecond or less range, 21 represents a voltage source variable from zero volts to a value higher than the breakdown voltages of interest, 22 represents a voltage meter, and 23 represents a recording device such as a X-Y recorder, a computer, or a counter. Since the events can also be recorded by their light flashes, 24 represents a device such as a photodiode which also can be used to detect mini-breakdown events. The speed at which the voltage from the voltage source 21 is increased throughout the measurement is preferably 0.1 to 1.0 volt per second to best resolve and record the transients.

Figure 5:
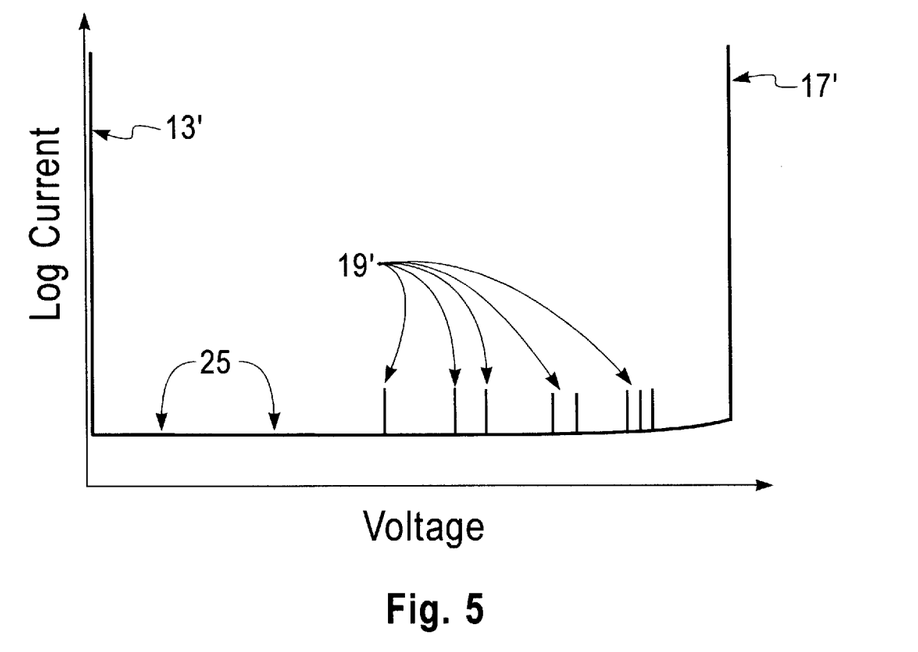
FIG. 5 is a graph showing a typical test structure output of the current (linear scale) versus voltage or the photodetector output versus voltage for the measurement using the circuit of FIG. 4.

FIG. 5 shows the typical output of an X-Y recorder or computer used to record the mini-beakdowns. The current-voltage behavior shown in FIG. 5 is the same as that shown in FIG. 3 except that FIG. 5 uses a linear scale for the ordinate and FIG. 3 uses a logarithmic scale, so, that the low current regions of FIG. 3 appear on the horizontal curve 25 of FIG. 5. However, the current transient, mini-breakdown events shown by 19' are easily detected in FIG. 5 because they are much larger than curve 25. The logarithmic scale and time averaging of a parameter analyzer as in FIG. 3 makes the mini-breakdown transients much harder to record with such instruments.

Short circuits shown by curve 13' and breakdown shown by curve 17' are also readily apparent in a linear scale such as FIG. 5.

Alternately to the use of an electrometer/ammeter 20 and voltmeter 22, a photodetector 24 may be used to record a mini-breakdown event by it's light flash. Photodiodes have even faster response times than electrometers and can record events which last only microseconds. Photodiode 24 can be connected to a computer data collector, counter, or similar recording device such that the occurrence of the light flash and the voltage at which it occurs are recorded simultaneously.

Figure 6:
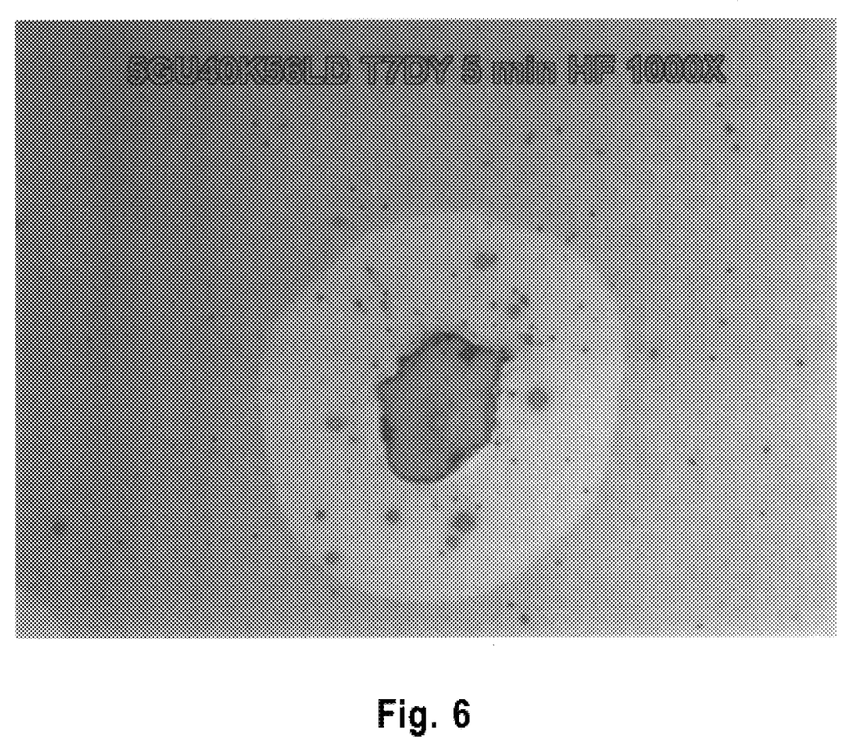
FIG. 6 is a photograph of a test device in which craters have been formed due to electrical testing.

Since each mini-breakdown generates not only a voltage spike and a light flash, but also a silicon crater all the way down to the buried oxide, a third method of characterizing the mini-breakdowns is to count the craters under an optical microscope or scanning electron microscope. With appropriate image recognition software this method can also be automated. Since the BOX at the site where the breakdown occurs is exposed, it is possible to enhance the defect by etching in HF (hydrofluoric acid) which will undercut the Si and dissolve the BOX surrounding the defect making it even easier to identify. This method does not have the breakdown voltage information, but can be used in a quality control application by stressing a mesa device at a fixed voltage for a short time and then counting the number of generated craters. Such an optical microscope picture of a test device 12 in which mini-breakdowns have taken place resulting in craters is shown in FIG. 6, where 26 represents the crater formed as the result of the current transient/mini-breakdown and 27 represents the area in which the Si has been undercut by HF.

Figure 7:
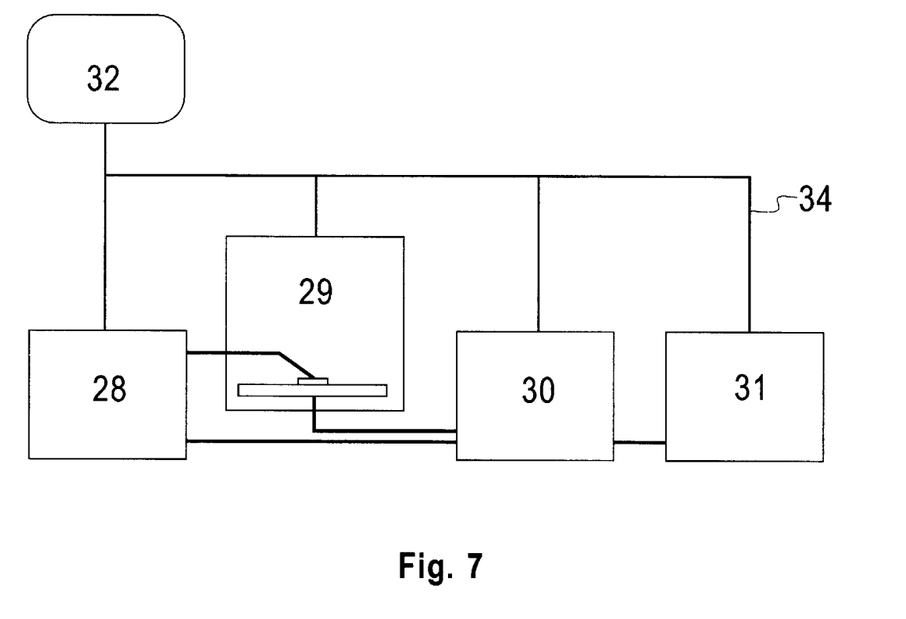
FIG. 7 is a block diagram of an automated test setup used for automated testing, data collection, and analysis.

FIG. 7 shows a preferred embodiment of the experimental setup that lends itself to automation. Analog connections are shown as thick solid lines, digital connections are over lead 34. A voltage ramp is generated by a programmable power supply 28, e.g. the voltage ramp section of an HP4140B. The test device is positioned on a programmable X-Y stage 29, e.g. an Electroglas 2001X or similar. A programmable electrometer 30 such as a Keithley 617, Keithley 6517A or similar is used as a current amplifier. Its preamp output is fed into a fast data tracker 31 such as an HP34970A. Alternatively, an oscilloscope with deep storage buffer, e.g. HP54621A or similar, may be used. From there the data are transferred into a computer 32 for realtime analysis. Computer 32 can detect the transient and record the individual minibreakdowns and the voltages at which they occur.

Figure 8:
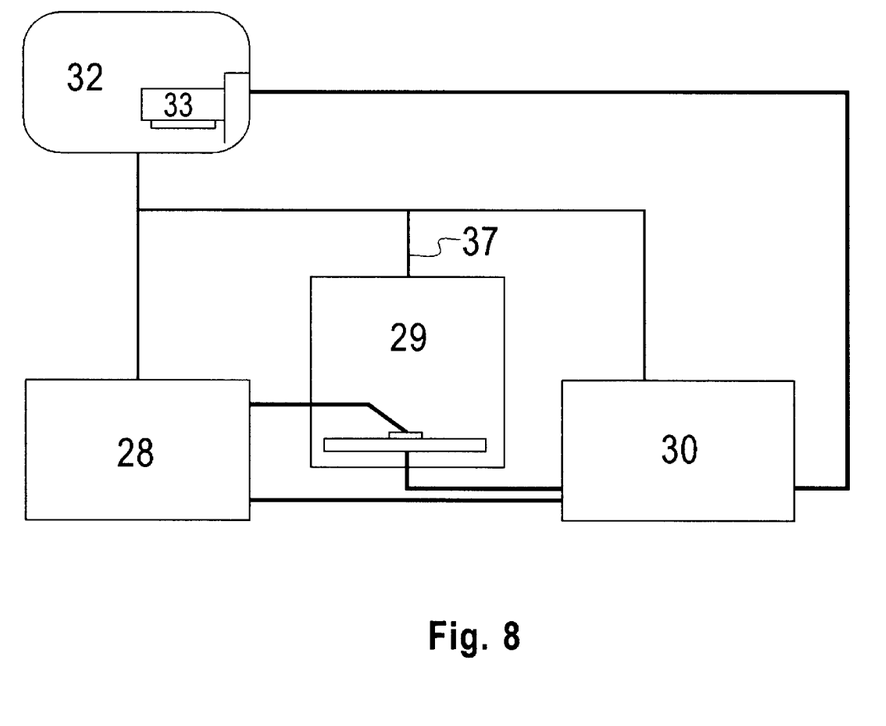
FIG. 8 is a block diagram of an alternate automated test setup.

FIG. 8 shows a second preferred embodiment of the experimental setup. Programmable voltage ramp generator 28, X-Y stage 29 and electrometer 30 are as described above. The preamp output of the electrometer 29 is fed directly over lead 37 into a data acquisition card 33 such as a NI 6035E or similar, residing in a computer 32 where the data are analyzed.

The voltages at which mini-breakdown events occur and the number of such events at voltages comparable to those used in circuit processing are highly important in quality control of SOI starting material. Electrical measurements in accordance with the invention allow circuit fabrication facilities to choose the best SOI wafers or starting material and to separate out the starting material which would result in low circuit yield and therefore high expense. Though the measurement is destructive in that the SOI wafer on which the measurements are made may not be used in subsequent circuit fabrication, SOI starting material is fabricated in batches for which any one wafer represents the whole, and the results for the one wafer is representative of the entire batch.

While there has been described and illustrated a method for assessing yield-limiting asperities in SOI buried oxide, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for determining electrical quality of a buried oxide of a silicon-on-insulator wafer comprising the steps of:

forming a first metal electrode layer on a bottom surface of said silicon-oninsulator wafer, forming a second metal electrode layer on a top surface of said silicon-on-insulator wafer, patterning said second metal electrode layer into electrodes of individual test devices, removing material above said buried oxide from regions between said individual test devices, applying a voltage between said first metal electrode and one of said electrodes of individual test devices making a measurement of a current-voltage behavior of said buried oxide, recording current transients in said measurement of current-voltage behavior of said buried oxide, and repeating said measurement of current-voltage behavior using different ones of said individual test devices.

2. The method of claim 1 wherein said second metal electrode layer is formed from a metal selected from the group consisting of gold, platinum, palladium, mixtures thereof and alloys thereof.

3. The method of claim 2 wherein said step of removing material from regions between said individual test devices is carried out by a step of wet chemical etching using mixtures of nitric acid, hydrofluoric acid and acetic acid.

4. The method of claim 1 wherein said second metal electrode layer is aluminum and said step of removing material between said individual test devices is carried out by a process selected from the group consisting of plasma etching and reactive ion etching and combinations thereof.

5. The method of claim 1 wherein said recording of said current transients includes a step of using an electrometer with a 2 millisecond or smaller response time.

6. The method of claim 1 wherein said recording of said current transients includes a step of using a photodiode to detect light flashes occurring during said current transients.

7. A method of determining electrical quality of a buried oxide layer of a silicon-on-insulator wafer having a Si layer, comprising the steps of:

depositing a first electrode layer from a metal selected from the group consisting of aluminum, copper, chromium, titanium, and silver, on the bottom of said wafer.

depositing a second electrode layer from a metal selected from the group consisting of aluminum, gold, platinum and palladium on the Si layer of said wafer, patterning said second electrode layer into electrodes of individual test devices, removing said Si layer from regions between said individual test devices, applying a voltage between said first electrode layer and one of said electrodes of the individual test devices making a measurement of a current-voltage behavior of one of said individual test devices, repeating said measurement of current-voltage behavior on more of said individual test devices, determining a number of said individual test devices which exhibit short circuit behavior, determining leakage current of a selected number of said individual test devices at a preselected value of said applied voltage, applying means of detecting current transients in said measurement of current-voltage behavior caused by self-healing breakdown events, and repeating said step of applying means of detecting on a selected number of said individual test devices.

8. The method of claim 7 wherein said patterning of said second electrode layer is carried out by depositing said second electrode layer through holes in a mask.

9. The method of claim 7 wherein said first electrode layer is formed by depositing metal selected from the group consisting of copper and aluminum and said second electrode layer is formed by depositing aluminum.

10. The method of claim 9 wherein said removing said Si layer from regions between said individual test devices is carried out by one of plasma etching and reactive ion etching.

11. The method of claim 7 wherein said second electrode layer is formed by depositing metal selected from the group of gold, platinum, and palladium.

12. The method of claim 11 wherein said removing of said Si layer from regions between individual test devices is carried out by a wet chemical etching.

13. The method of claim 12 wherein said wet chemical etching is carried out with mixtures of nitric acid, hydrofluoric acid, and acetic acid.

14. The method of claim 12 wherein said wet chemical etching is carried out with mixtures of potassium hydroxide and water.

15. The method of claim 7 wherein said means of detecting current transients includes a current-measuring instrument with a response time of about 3 milliseconds or less.

16. The method of claim 7 wherein said step of applying means of detecting current transients includes using a photodiode and counting circuit to detect and count light flashes.

17. The method of claim 7 wherein said step of applying means of detecting current transients includes a step of using one of an optical microscope and scanning electron microscope examination after treatment by hydrofluoric acid.

18. The method of claim 7 wherein said current-voltage behavior of said one of said individual test devices includes said short circuit behavior, said leakage current, and said step of applying a means of detecting current transients includes using automated test equipment and automated data collection analysis.

* * * * *